(12) United States Patent
Jilek et al.

(10) Patent No.: US 12,298,666 B2
(45) Date of Patent: May 13, 2025

(54) ORGANOTIN PATTERNING MATERIALS WITH LIGANDS HAVING SILICON/GERMANIUM; PRECURSOR COMPOSITIONS; AND SYNTHESIS METHODS

(71) Applicant: Inpria Corporation, Corvallis, OR (US)

(72) Inventors: Robert E. Jilek, Philomath, OR (US); Kai Jiang, Corvallis, OR (US); Amrit K. Narasimhan, Corvallis, OR (US)

(73) Assignee: Inpria Corporation, Corvallis, OR (US)

( * ) Notice: Subject to any disclaimer, the term of this patent is extended or adjusted under 35 U.S.C. 154(b) by 0 days.

(21) Appl. No.: 18/654,160

(22) Filed: May 3, 2024

(65) Prior Publication Data

US 2024/0337941 A1    Oct. 10, 2024

Related U.S. Application Data

(63) Continuation of application No. 17/682,639, filed on Feb. 28, 2022, now Pat. No. 12,032,291.
(Continued)

(51) Int. Cl.
*G03F 7/075* (2006.01)
*G03F 7/11* (2006.01)
*G03F 7/16* (2006.01)

(52) U.S. Cl.
CPC ............ *G03F 7/075* (2013.01); *G03F 7/11* (2013.01); *G03F 7/168* (2013.01)

(58) Field of Classification Search
None
See application file for complete search history.

(56) References Cited

U.S. PATENT DOCUMENTS 9,310,684 B2    4/2016 Meyers et al.
10,228,618 B2   3/2019 Meyers et al.
(Continued)

FOREIGN PATENT DOCUMENTS

EP          1067595 A1      1/2001
WO       2017-0066319 A2    4/2017
(Continued)

OTHER PUBLICATIONS

Janssen et al., "The First Stable Monomeric Triaminostannane of Composition [(Me3Si)3CSn(NHtBu)3] Containing Three Substituted NH Groups", European Journal of Inorganic Chemistry, vol. 2003 No. 24, p. 4338-4340, (Dec. 2003). (Abstract Only).
(Continued)

*Primary Examiner* — Sean M DeGuire
*Assistant Examiner* — Andrew Preston Traywick
(74) *Attorney, Agent, or Firm* — Christensen, Fonder, Dardi PLLC; Diane E. Bennett; Peter S. Dardi

(57) ABSTRACT

As described herein, photosensitive composition comprises $RSnL_3$, where R is a hydrocarbyl ligand with 1-20 carbon atoms and one or more silicon and/or germanium heteroatoms and L is an acetylide ligand (—C≡CA, where A is a silyl group with 0 to 6 carbon atoms or an organo group with 1 to 10 carbon atoms). Methods are described wherein photosensitive compositions are synthesized by reacting RX, where X is a halide, and $MSnL_3$, where M is an alkali metal, alkali earth metal or a pseudo-alkali earth metal, L is an acetylide or a dialkylamide. The radiation sensitive compositions are effective for radiation based patterning, such as with EUV light.

11 Claims, 8 Drawing Sheets

Related U.S. Application Data

(60) Provisional application No. 63/210,769, filed on Jun. 15, 2021.

(56) References Cited

U.S. PATENT DOCUMENTS

| | | | |
|---|---|---|---|
| 2016/0359060 A1* | 12/2016 | Deshmukh | C07F 5/069 |
| 2017/0102612 A1 | 4/2017 | Meyers et al. | |
| 2019/0302615 A1* | 10/2019 | Krysak | G03F 7/0043 |
| 2019/0315781 A1 | 10/2019 | Edson et al. | |
| 2020/0241413 A1 | 6/2020 | Clark et al. | |
| 2022/0002323 A1 | 1/2022 | Ermert et al. | |
| 2022/0064192 A1 | 3/2022 | Edson et al. | |

FOREIGN PATENT DOCUMENTS

| | | |
|---|---|---|
| WO | 2019-217749 A1 | 11/2019 |
| WO | 2020-264158 A1 | 12/2020 |

OTHER PUBLICATIONS

Lamande-Langle et al., "A Novel Mode of Access to Polyfunctional Organotin Compounds and Their Reactivity in Stille Cross-Coupling Reaction", Journal of Organometallic Chemistry, vol. 694, p. 2368-2374, (2009).

International Search Report for corresponding Patent Application No. PCT/US2022029747 dated Sep. 5, 2022.

* cited by examiner

FIG. 7

ORGANOTIN PATTERNING MATERIALS WITH LIGANDS HAVING SILICON/GERMANIUM; PRECURSOR COMPOSITIONS; AND SYNTHESIS METHODS

CROSS REFERENCE TO RELATED APPLICATIONS

This application is a continuation of copending U.S. patent application Ser. No. 17/682,639 to Jilek et al. filed Feb. 28, 2022, entitled "Organotin Patterning Materials With Ligands Having Silicon/Germanium; Precursor Compositions; And Synthesis Methods", which claims priority to U.S. provisional patent application 63/210,769 to Jilek et al. filed Jun. 15, 2021, entitled "Organotin Patterning Materials: Compositions and Methods," incorporated herein by reference.

FIELD OF THE INVENTION

The invention relates to compositions of mono-organotin triamides, mono-organotin triacetylides or mono-organotin trioxides, wherein the organo group is defined as a hydrocarbyl containing Si or Ge heteroatoms. The invention further relates to hydrolysis products, to synthesis of the compositions, and to methods of performing radiation patterning.

BACKGROUND OF THE INVENTION

Organometallic compounds provide metal ions in solution and vapor forms for deposition of thin films. Organotin compounds provide high EUV absorption and radiation sensitive tin-ligand bonds that can be used to lithographically pattern thin films. The manufacture of semiconductor devices at ever shrinking dimensions with EUV radiation requires new materials with wide process latitude to achieve required patterning resolutions and low defect densities.

SUMMARY OF THE INVENTION

In a first aspect, the invention pertains to improved photosensitive compositions $RSnL_3$, where R is a hydrocarbyl ligand with 1-20 carbon atoms and one or more silicon or germanium heteroatoms. L forms a hydrolysable Sn-L bond. In some embodiments. L is an acetylide ligand (—C≡CA, where A is a silyl group with 0 to 6 carbon atoms, or an organo group with 1 to 10 carbon atoms, such as a phenyl group). In further embodiments, the photosensitive composition has R represented as $(R^4)_3Si(CH_2)_nCR_2^5$—, where n is 0 to 8, $R^4$ and $R^5$ are independently hydrogen, a halide, or a hydrocarbyl group with 1 to 4 carbon atoms and L is a hydrolysable ligand.

In a further aspect, the invention pertains to a method for production of $RSnL_3$ wherein R is a hydrocarbyl group with 1-20 carbon atoms and one or more silicon or germanium heteroatoms, and L is a hydrolysable ligand. The method comprises reacting RX, where X is a halide, and $MSnL_3$, where M is an alkali metal, alkali earth metal or a pseudo-alkali earth metal. In general, L is an acetylide (C≡CA, where A is a silyl group with 0 to 6 carbon atoms or an organo group with 1 to 10 carbon atoms, such as a phenyl group) or a dialkylamide with 1 to 10 carbon atoms, wherein the reaction forms $RSnL_3$ with a Sn—C bond wherein R is a hydrocarbyl ligand with 1-20 carbon atoms and one or more silicon and/or germanium heteroatoms.

In a further aspect, the invention pertains to the $RSnL_3$ composition and its formulation as a solution precursor for deposition of a radiation-sensitive thin-film photoresist.

In a further aspect, the invention pertains to methods for forming coatings with the photosensitive compositions.

In a further aspect, the invention pertains to methods for irradiating and developing the coated thin film to produce a nanostructured pattern. A method for patterning an organometallic compound comprises forming a coating on a substrate, wherein forming the coating comprises depositing $RSnL_3$, wherein R is a hydrocarbyl group with 1-20 carbon atoms and one or more silicon or germanium heteroatoms, and L is a hydrolysable ligand, irradiating the coating with radiation to form a latent image; and developing the image to form a patterned coating with nanoscale features according to the latent image.

BRIEF DESCRIPTION OF THE DRAWINGS

FIG. 7 is a set of electron microscope images of line-space patterns for E-TMS resist processed at selected post-exposure bake temperatures.

DETAILED DESCRIPTION OF THE INVENTION

Figure 1:
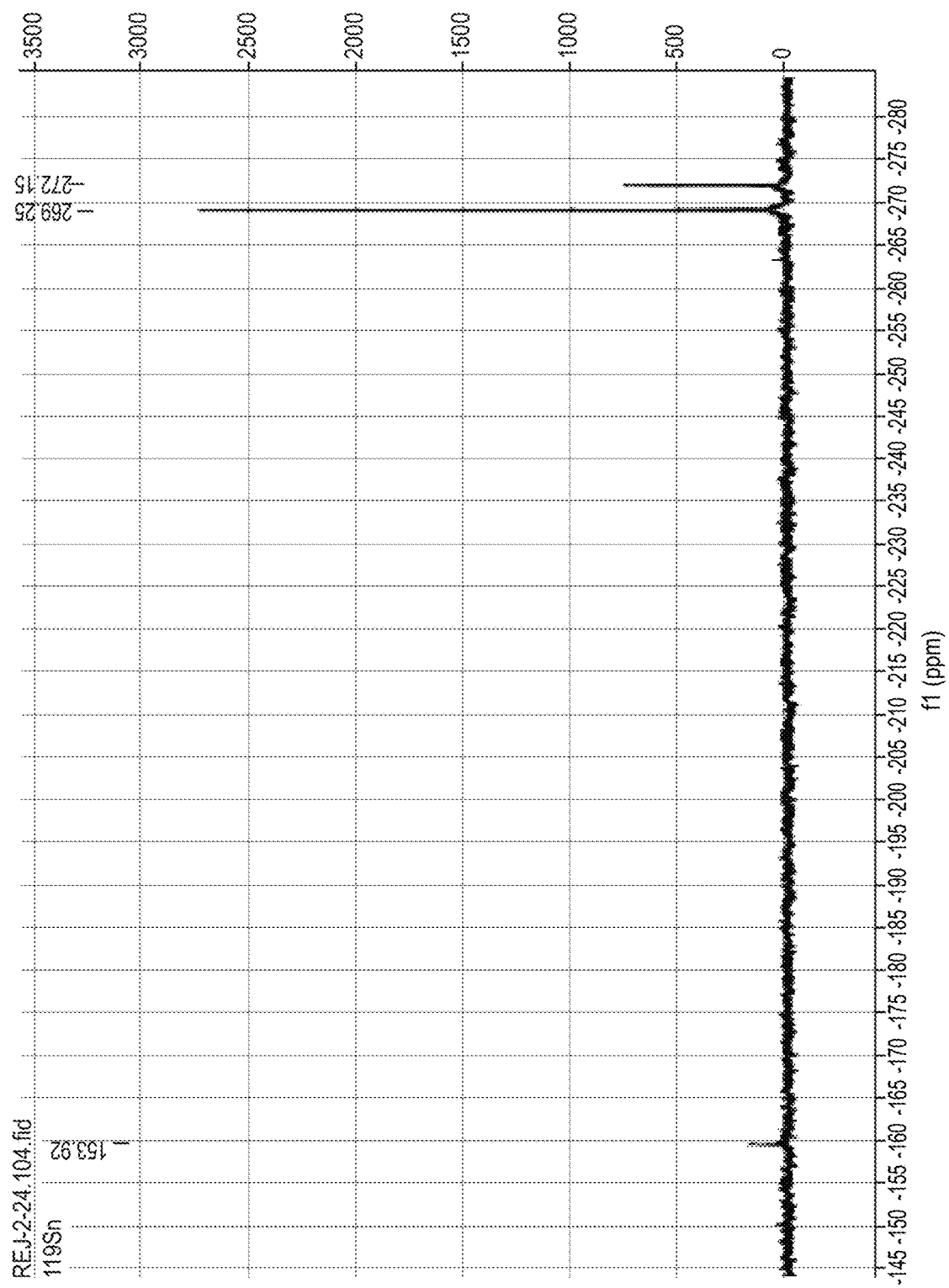
FIG. 1 is a plot of a $^{119}$Sn NMR spectrum of ethyltrimethylsilyltin tris(trimethylsilylacetylide) $[(CH_3)_3SiCH_2CH_2Sn(TMSA)_3]$.

Organotin compositions have been synthesized with organo ligands having silicon/germanium atoms that offer the possibility of greater radiation absorption as well as greater ligand stability prior to irradiation to facilitate radiation based patterning. The compounds are prepared as precursors with hydrolysable ligands, which can undergo hydrolysis for formation of a patternable layer. The precursor compounds generally have a single carbon tin bond that is susceptible to radiation cleavage to form a virtual image upon irradiation. The organo ligand forming the C—Sn bond comprises a Si or Ge substituent, such as a silyl group, and $(CH_3)_3SiCH_2CH_2SnL_3$ is exemplified. The suitability of this compound for EUV patterning is demonstrated in the examples below.

Organometallic photoresists, particularly those based on organotin materials, function as high performance EUV photoresists that can enable patterning of high-resolution, high-fidelity patterns. These materials can generally operate as negative tone photoresists, wherein irradiated regions remain after development, or as positive tone photoresists, wherein irradiated regions are selectively removed during development.

Radiation-sensitive organotin compositions that are useful as high-resolution and high-sensitivity photoresists have been described by Meyers et. al. in U.S. Pat. No. 9,310,684, entitled "Organometallic Solution Based High Resolution Patterning Compositions", and in U.S. Pat. No. 10,228,618 (hereinafter the '618 patent) entitled "Organotin oxide hydroxide patterning compositions, precursors, and patterning", both of which are incorporated herein by reference. In general, the radiation sensitive organotin compositions comprise organic ligands bound to the Sn atoms via Sn—C and/or Sn-carboxylate bonds. The present disclosure describes new silicon/germanium enriched organotin compositions that have been discovered and that can exhibit improved patterning and processing over non-enriched organotin compositions.

It is believed that exposure of organotin materials to EUV radiation and subsequent processing can cleave Sn—C bonds and enable formation of new Sn—O—Sn and Sn—OH bonds in the irradiated regions. After fragmenting the S—C bonds, the increased concentration of the Sn—O—Sn and S—OH bonds results in a more condensed and hydrophilic material relative to the unexposed material, thereby creating a large chemical and development contrast between irradiated and unirradiated regions. To take advantage of this contrast, it is desirable to identify new materials that expand the lithographic process window and improve the fidelity of patterned structures. This process window, for example, can be expanded by substituting high atomic number heteroatoms such as silicon or germanium for the carbon atoms in the organo ligand.

It has been discovered that substitution of a carbon atom with a silicon or germanium atom in the hydrocarbyl group of a monoalkyltin photoresist can improve its thermal stability and expand the lithographic process window. The compositions described herein are useful as precursors for forming radiation patternable coatings, as well as for converting the precursors into other useful compositions, such as compositions with different hydrolysable ligands or cluster-like compositions having Sn—O—Sn bonds. As described above, the photosensitivity of organotin materials arises from the character of the Sn—C bond and it is therefore generally desirable for the Sn—C bond to remain intact during processing from precursor to coating.

The hydrolysable ligands have little effect on photosensitivity since they are generally hydrolyzed to form oxo-hydroxo rich coatings having Sn—OH and/or Sn—O—Sn bonds prior to irradiation. The hydrolysable ligands are generally selected for synthesis advantages and desired processing, such as further purification, mode of deposition, stability, handling, and so on. Similarly, the availability of a convenient synthesis pathway is also significant.

Silicon and germanium are in the same group of the period table as carbon. Thus, silicon and germanium can exhibit similar chemical structures and other properties, while also exhibiting differences due to their higher atomic mass. Thus, silicon and germanium can form alternative hydrocarbon like structures and corresponding moieties in side groups off of carbon based hydrocarbyl ligands. The compounds of particular interest here have one or more silicon/germanium atoms within the hydrocarbyl structure extending from the carbon atom directly bonded to the tin atom.

As described herein, the hydrolysable ligand is a ligand that promotes reaction of an organotin molecule with $H_2O$ to produce an organotin oxide hydroxide (or organotin oxide hydroxide hydrate) composition illustrated by the following ideal reaction:

$$RSnL_3 + 2H_2O \rightarrow RSnOOH + 3HL. \tag{1}$$

Some examples of suitable hydrolysable ligands (L) are —NR'$_2$, —OR', or —CCR' wherein R' is a silyl group or an hydrocarbyl group having no more than 12 carbon atoms. Some examples of L include, but are not limited to, —NMe$_2$, —NEt$_2$, —OnPr, —OiPr, —OtBu, —OtAmyl, —CC(Si (CH$_3$)$_3$) [trimethylsilyl acetylide (TMSA)], —CC(C$_6$H$_5$) [phenylacetylide], and the like. R can be considered to be represented by $R_1R_2R_3C$—, where $R_1$ is a hydrocarbyl group or a silyl group comprising at least one silicon atom, and $R_2$, $R_3$ can independently be a H, X (halide), a silyl group, or a hydrocarbyl group that may or may not comprise a silicon atom in which R can comprise in total from 1 to 20 carbon atoms. With the precursors incorporating silicon/germanium, the embodiments of particular interest herein involve ligands with the structure: —CR'$_n$(CH$_2$)$_m$(SIR'')$_o$, where o is 1 to 3, m is 0 to 2, n is 0 to 2, n+m+0=3, R' and R'' are independently (both from each other and from other members of the R' and R'' moieties) H, or hydrocarbyl groups having 1 to 3 carbon atoms.

Applicant has developed several techniques to synthesize and purify a range $RSnL_3$ compounds, in which the methods offer significant advantages, in particular lower polyalkyl contaminants, good yields and use of more readily available reactants. Desirable results have been achieved in which the alkylating agent may be a Grignard reagent, a diorganozinc reagent, or a mono-organozinc amide. These syntheses can directly produce the monoalkyl tin triamides with low polyalkyl contaminants that can be used for forming resists or that can be further purified to reduce the contaminant levels even further. In the synthesis methods, the alkylating agent selectively replaces an amide group of tin tetraamide with the alkyl group. In some embodiments, the reaction selectively produces monoalkyl tin triamide with low polyalkyl tin contaminants, particularly low dialkyl tin contaminants. The synthesis methods described improve the selectivity and yield of monoalkyl tin triamides by limiting the formation of dialkyl tin byproducts. The methods are especially useful for branched alkyl systems. The monoalkyl tin triamides with low polyalkyl contaminants can then be used to form monoalkyl tin trialkoxides with low polyalkyl contaminants. These improved synthesis techniques are described in published U.S. patent application 2019/0315781 to Edson et al., entitled "Monoalkyl Tin Compounds With Low Polyalkyl Contamination, Their Compositions and Methods," incorporated herein by reference.

A further synthesis technique was developed to further obtain desired yields and purity in practical techniques for a broader range of organo ligands forming a C—Sn bond. In these synthesis reactions, the hydrocarbyl ligands are generated from an organohalide reactant. The organohalide reactants are readily available for a wide range of compounds to supply the ligands. While other synthesis techniques may be generally applicable for the synthesis of a range of hydrocarbyl ligands, there may be practical constraints with respect to the reactant compositions to introduce the ligands as well as yields, reaction times, selection of suitable solvents and potentially other practical constraints. These reactions have been designed to form either trialkyl amine hydrolysable ligands (e.g., RSn(NR'$_2$)$_3$) or triacetylide hydrolysable ligands (e.g., RSn (CCR')$_3$). The synthesis of alkali metal tin compounds provide an effective intermediate that may be useful also in other contexts. These techniques are adapted for the synthesis of the silicon containing compounds described herein and are exemplified below. These synthesis techniques are described in more detail for a range of hydrocarbyl ligands in copending U.S. patent application Ser. No. 17/410,316 to Edson et al. (hereinafter the '316 application), entitled "Methods to Produce Organotin Compositions With Convenient Ligand Providing Reactants," incorporated herein by reference. For products with significant vapor pressures, it can be desirable to purify the product through vacuum distillation or, if desired, fractional distillation designed to achieve high purity. See published U.S. patent application 2020/0241413 to Clark et al., entitled "Monoalkyl Tin Trialkoxides and/or Monoalkyl Tin Triamides With Low Metal Contamination and/or Particulate Contamination and Corresponding Methods," incorporated herein by reference. Products can be also reacted to form derivatives, such as organo tin trialkoxides, which can be further purified by the techniques above and other means known in the art.

A somewhat similar but less desirable synthesis approach to that described in the '316 application is described in published U.S. patent application 2022/0002323 to Ermert et al., entitled "Process for Preparing Organotin Compounds," incorporated herein by reference. In the process of the '323 application a less than stoichiometric amount of lithium dialkylamide is added. As a result, a dihalo tin dimer with two bridging amide ligands precipitates as a by-product. Based on the observed side reactions, the maximum yield based on the tin is 0.5. In Applicant's method, no stoichiometric tin byproducts are formed as contaminants.

Hydrolysis of the $RSnL_3$ composition above generally yields hydroxide and oxide rich products where two or more RSn moieties are condensed to form Sn—O and Sn—OH bonds, for example, the "football" cluster $(RSn)_{12}O_{14}(OH)_8$ and related intermediate compositions. As described below, hydrolysis of the instant $RSnL_3$ compositions can be used to prepare radiation patternable coatings with networks of oxo-hydroxo ligands bonded to Sn atoms with Sn—OH and Sn—O—Sn linkages. For formation of radiation patternable coatings, the hydrolysis can take place during or after coating formation, but generally prior to irradiation. The coatings can be deposited using solution or vapor approaches.

R forms a carbon-tin bond wherein the carbon bound to the tin is $sp^3$ or $sp^2$ hybridized, and R comprises at least one silicon atom and can comprise optionally unsaturated or aromatic carbon-carbon moieties and/or other heteroatoms, which are not carbon or hydrogen. As noted above, for convenience as well as consistency in the art, R can be interchangeably referred to as an alkyl ligand, organo ligand or hydrocarbyl ligand, with the corresponding substituents and bonding structures.

In some embodiments, hydrocarbyl ligands can be desirable for some patterning compositions where the compound (following hydrolysis of hydrolysable ligands) can be represented generally as $R^1R^2R^3CSn\ O_{(2-(z/2)-(x/2))}(OH)_x$, where $R^1$ comprises a silicon/germanium atom and 0-10 carbon atoms, and $R^2$ and $R^3$ are independently hydrogen or a hydrocarbyl group with 1-10 carbon atoms, such that in some embodiments $R^1R^2R^3C$ has a total of 1 to 20 carbon atoms. This representation of hydrocarbyl ligand R is similarly applicable to the other embodiments generally with $R^1R^2R^3CSn\ (L)_3$, with L corresponding to hydrolysable ligands, such as alkoxide (hydrocarbyl oxide), acetylide or amide moieties. In some embodiments, $R^2$ and $R^3$ can form a cyclic alkyl moiety, and $R^1$ may also join the other groups in a cyclic moiety. Suitable branched ligands can be, for example, ($R^2$ and $R^3$ are methyl and $R^1$ is a silyl group), ($R^1$ is a silyl group, $R^2$ is methyl and $R^3$ is —$CH_2CH_3$), and ($R^1$ is silyl, $R^2$ is methyl or —$CH_2CH_3$, and $R^3$ is hydrogen). The exemplified embodiment is $(CH_3)_3SiCH_2CH_2$—, corresponding with $R^1$ being $(CH_3)_3SiCH_2$— and $R^2$ and $R^3$ being hydrogen, and additional related embodiments are described below. In other embodiments, hydrocarbyl groups may include aryl or alkenyl groups, for example, benzyl or allyl, or alkynyl groups. In further embodiments, suitable R groups may include hydrocarbyl groups substituted with non-silicon/germanium hetero-atom functional groups including cyano, thio, ether, keto, ester, or halogenated groups or combinations thereof. As is conventional in this art, the hydrocarbyl group can be referred to as an alkyl group even though the group can have unsaturated bonds, aryl groups, heteroatoms, and so forth.

In some embodiments, R is $(R^4)_3Si\ (CH_2)_nCR_2^5$—, where n is 0 to 8, or in further embodiments n is 0 to 3 or 0 to 2, $R^4$ and $R^5$ are independently hydrogen or a halide (F, Cl, Br, or I), or a hydrocarbyl group with 1 to 4 carbon atoms. In some embodiments, $R^4$ is a hydrogen, methyl group (—$CH_3$) or ethyl (—$CH_2CH_3$). In some embodiments, n is 0 to 2, $R^5$ is methyl and $R^4$ is methyl group (—$CH_3$) or ethyl (—$CH_2CH_3$). In these ligands, $R^2$, $R^3$ (in the notation above) are both $R^5$. The examples have R equal to $(CH_3)_3Si\ CH_2CH_2$—.

For use in patterning compositions, it can be desirable to convert a product with trialkamide or triacetylide ligands to an organo tin trialkoxide. As described further below, this reaction is generally performed following purification with distillation through a reaction with a corresponding alcohol, although in some embodiments it may be appropriate to directly form the alkoxide without first purifying the triamide or triacetylide. The product organo tin trialkoxide generally is an oil or low-melting point solid that can be purified through distillation. These steps are described further below and are outlined in the following examples for a particular product. Conversion of the precursor compositions to trialkoxides is not required to form a coating precursor, but organotin trialkoxides can be convenient precursors for deposition because of the benign volatile products, e.g., alcohols, after hydrolysis and coating formation.

After preparation of the desired organotin precursor, the precursor can be dissolved in an appropriate solvent to prepare a precursor solution, such as an organic solvent, e.g., alcohols, aromatic and aliphatic hydrocarbons, esters or combinations thereof. In particular, suitable solvents include, for example, aromatic compounds (e.g., xylenes, toluene), ethers (anisole, tetrahydrofuran), esters (propylene glycol monomethyl ether acetate, ethyl acetate, ethyl lactate), alcohols (e.g., 4-methyl-2-pentanol, 1-butanol, methanol, isopropyl alcohol, 1-propanol), ketones (e.g., methyl ethyl ketone), mixtures thereof, and the like. In general, organic solvent selection can be influenced by solubility parameters, volatility, flammability, toxicity, viscosity and potential chemical interactions with other processing materials. After the components of the solution are dissolved and combined, the character of the species may change as a result of partial in-situ hydrolysis, hydration, substitution, and/or condensation.

The organotin precursors can be dissolved in the solvent at concentrations to afford concentrations of Sn suitable for forming coatings of appropriate thickness for processing. The concentrations of the species in the precursor solutions can be selected to achieve desired physical properties of the solution. In particular, lower concentrations overall can result in desirable properties of the solution for certain coating approaches, such as spin coating, that can achieve thinner coatings using reasonable coating parameters. It can be desirable to use thinner coatings to achieve ultrafine patterning as well as to reduce material costs. In general, the concentration can be selected to be appropriate for the selected coating approach. Coating properties are described further below. In general, tin concentrations comprise from about 0.005M to about 1.4M, in further embodiments from about 0.02 M to about 1.2 M, and in additional embodiments from about 0.1 M to about 1.0 M. A person of ordinary skill in the art will recognize that additional ranges of tin concentrations within the explicit ranges above are contemplated and are within the present disclosure.

In some embodiments, improved photosensitive precursor compositions can be present in a blended solution with one or more organotin compositions, such as $R_nSnL_{4-n}$ and its hydrolysates, where R is chosen from the various moieties described in detail herein and elaborated on explicitly above and may or may not be the same in the various components of the blended precursor composition. Such blended solutions can be tuned for optimization of various performance considerations, such as solution stability, coating uniformity, and patterning performance. Blended compositions can be achieved by combing two or more organotin compositions, such as $R_nSnL_{4-n}$, where L is a hydrolysable ligand, with or without a solvent. For example, neat $RSnL_3$ can be combined with neat $R'SnL_3$ to form a blended precursor. The blended composition can then be diluted into a solvent, if desired. Alternatively, each individual organotin composition can be diluted into a desired solvent to form a distinct organotin solution, and then each individual organotin solution can then be combined to form a blended solution. In general, the hydrolysable ligand can be the same or different for each individual organotin component of the overall blended composition. In some embodiments, the improved photosensitive composition can comprise at least 1% by mol. Sn of a desired component in the blended solution, in further embodiments at least 10% by mol. Sn of the blended solution, in further embodiments at least 20% by mol. Sn of the blended solution, and in further embodiments at least 50% by mol. Sn of a specific desired component of the blended solution. Additional ranges of mol % of the improved photosensitive composition within the explicit ranges of the blended solution are contemplated and within the present disclosure.

Owing generally to their high vapor pressures, the organotin compositions described herein can be useful as precursors for forming coatings via vapor deposition. Vapor deposition methods generally include chemical vapor deposition (CVD), physical vapor deposition (PVD), atomic layer deposition (ALD), and modifications thereof. In a typical vapor deposition process, the organotin composition can be reacted with small molecule gas-phase reagents such as $H_2O$, $O_2$, $H_2O_2$, $O_3$, $CH_3OH$, $HCOOH$, $CH_3COOH$, and the like, which serve as O and H sources for production of radiation sensitive organotin oxide and oxide hydroxide coatings. Organotin compositions with alkylamides or alkoxides as hydrolysable ligands can be particularly desirable for use in vapor deposition techniques to form organotin oxide/hydroxide coatings. Vapor deposition of radiation patternable organotin coatings has been described by Wu et. al in PCT Application #PCT/US2019/031618 entitled "Methods for Making EUV Patternable Hard Masks", incorporated herein by reference, as well as in the '618 patent cited above. Production of radiation sensitive organotin coatings can generally be achieved by reacting the volatile organotin precursor $RSnL_3$ with a small gas-phase molecule. The reactions can include hydrolysis/condensation of the organotin precursor to hydrolyze the hydrolysable ligands while leaving the Sn—C bonds substantially intact.

With respect to an outline of a representative process for a radiation based patterning, e.g., an extreme ultraviolet (EUV) lithographic process, photoresist material is deposited or coated as a thin film on a substrate, pre-exposure baked, exposed with a pattern of radiation to create a latent image, post-exposure baked, and then developed with a liquid, typically an organic solvent, or with a dry development technique, to produce a developed pattern of the resist. Fewer steps can be used if desired, and additional steps can be used to remove residue to improve pattern fidelity.

The thickness of the radiation patternable coating can depend on the desired process. For use in single-patterning EUV lithography, coating thicknesses are generally chosen to yield patterns with low defectivity and reproducibility of the patterning. In some embodiments, suitable coating thickness can from between 0.5 nm and 100 nm, in further embodiments from about 1 nm to 50 nm, and in further embodiments from about 2 nm to 25 nm. Those of ordinary skill in the art will understand that additional ranges of coating thickness are contemplated and are within the present disclosure. Coating thickness for radiation patternable coatings prepared by vapor deposition techniques can generally be controlled through appropriate selection of reaction time or cycles of the process.

The substrate generally presents a surface onto which the coating material can be deposited, and it may comprise a plurality of layers in which the surface relates to an upper most layer. The substrate is not particularly limited and can comprise any reasonable material such as silicon, silica, other inorganic materials, such as ceramics, and polymer materials. The silicon containing material are observed to have improved stability after application as a radiation sensitive coating. This stability improvement is further described below.

Preparation of Improved Compositions

Various synthesis embodiments can be adapted for the synthesis that are based on a common concept of first synthesizing an intermediate mixture represented with the formula of $MSnL_3$, where M is one or more (+1) or (+2) metal ions and L is a hydrolysable ligand, specifically a dialkylamide or an alkyl acetylide. Generally, the intermediate is formed at concentrations based on tin content from about 0.005M to about 2M, in further embodiment from about 0.01M to about 1.75M and in other embodiments from about 1.5M to about 0.025M. A person of ordinary skill in the art will recognize that additional ranges of concentration within these explicit ranges are contemplated and are within the present disclosure. This intermediate is reacted with RX where X is a halide atom to form $RSnL_3$, which can be further used as desired. In some embodiments, M can be Li. In other embodiments, M can be another alkali metal, for example Na, K, Rb, or Cs. In some embodiments, M can further comprise an alkaline earth metal, for example Mg, Ca, Sr, or Ba, along with the alkali metal. In further embodiments, M can further comprise a pseudo-alkaline earth ion, for example Zn, Cd, or Hg along with the alkali metal. In some embodiments, M can be a mixture of any of the aforementioned alkali metals, alkali-earth metals, or pseudo alkaline earth metals. Proper selection of M can be driven by thermodynamic and/or kinetic factors, for example electronegativity differences between M and Sn, that allow the desired alkylation (i.e., the formation of the Sn—C bond) reaction to proceed with suitable yields and purity. The exemplified synthesis is performed with potassium K ions. Other factors that can influence selection of suitable M may be physical considerations such as hazards presented by reactants/product (for example, pyrophoricity, toxicity) and physical properties of reactants/products. In any case, it has been discovered that better yields and purer products can be achieved in some circumstances by using alternative alkali metal ions in place of or in addition to lithium or by introducing alkaline earth or pseudo-alkaline earth ions in additional to lithium or other alkali metal ion. The intermediates are stable (e.g., no precipitates are formed), but due to their reactivity and consequent difficulty in isolating them, the structure of the intermediates is surmised from available measurements and review of reasonable alternatives. Therefore, the idealized formula $MSnL_3$ can be more accurately understood to be a complex intermediate mixture where M can comprise one or more metals as described above.

While not wanting to be limited by theory, it is believed that proper selection of M can be influenced by the reactivity of the alkylation reaction between the $MSnL_3$ intermediate, a nucleophile, and RX, an electrophile. For more reactive R groups, for example groups having low C—Sn bond dissociation energies and/or having high electrophilicities, the release of energy that occurs from the alkylation reaction is thought to contribute to decomposition of the Sn—C bond, resulting in poor product yield. It can therefore be desirable for M to include metals of higher electronegativity (i.e., less electropositive) in order to reduce the energy released when the electrophilic alkylhalide reacts with the nucleophilic $MSnL_3$ intermediate. Conversely, for less reactive R groups, it can be desirable to choose metals with lower electronegativities (i.e., more electropositive) to increase the yield of the desired RSn bond.

Based on these principles, the photosensitive composition can be synthesized through a two-step process represented by the following reactions:

$$RX + MSnL_3 \rightarrow RSnL_3 + MX,$$

$$RSnL_3 + \text{excess } R^aOH \rightarrow RSn(OR^a)_3, \qquad (2)$$

where M is a metal ion (alkali, alkali earth or pseudo-alkali earth), X is a halide (F, Cl, Br, or I) and hydrolysable ligand L is an dihydrocarbylamide or an organo (hydrocarbyl or silyl) acetylide. In the exemplified form, the reactions involve M=K and L=TMSA so the reactions become:

$$RX + KSn(TMSA)_3 \rightarrow RSn(TMSA)_3 + KX,$$

$$R(TMSA)_3 + \text{excess } R^aOH \rightarrow RSn(OR^a)_3. \qquad (3)$$

wherein R is a hydrocarbyl group with one or more silicon or germanium heteroatoms as described above, X is a halide, and Ra is a hydrocarbyl group with ≤12 carbon atoms. $(CH_3)_3SiCH_2CH_2$— is a representative R group, and methyl, ethyl, n-propyl, isopropyl, n-butyl, tert-butyl, sec-butyl, amyl and tert-amyl are examples of Ra. The wide availability of RX compounds as reactants as well as the broad reactivity of the compounds in the corresponding reactions provides an ability to introduce a wide range of R ligands into the product for formation of many mono-organo tin compositions.

In general terms, heavy atom(silicon/germanium) enriched monohydrocarbyl tin triamides and monohydrocarbyl tin triacetylides can be prepared by the following overall reactions:

$$3\ HNR'_2 + 3\ MR''(+M'Z) + SnX_2 + RX' \rightarrow RSn(NR'_2)_3 + \text{byproducts, or}$$

$$3\ R'CCH + 3\ MR''(+M'Z) + SnX_2 + RX' \rightarrow RSn(CCR')_3 + \text{byproducts.} \qquad (4)$$

wherein X, X' are independently halides, and R" generally is a hydrocarbyl group with ≤10 carbon atoms. R" becomes incorporated into a by-product, generally HR", so its identity is generally not particularly limited or significant, and it can be selected for general availability, low cost, ease of removal of the by-product, and good reactivity. Some suitable examples of R" are methyl, ethyl, propyl, n-butyl and tert-butyl. The R' groups provide the substituents for the corresponding hydrolysable ligands of the product compositions, as described above. In these reactions, M generally is lithium, but lithium can be replaced with other alkali metals, i.e., sodium, potassium, rubidium and cesium. The parenthetical M'Z represents optional reactants M"OR" or M'"$X_2$, where M" is an alkali metal ion, OR" is an alkoxide that remains passive, and M'" is an alkaline earth/pseudo-alkaline earth metal ion provides as the halide with X being a halide ion. These reactions are described further in the '316 application, cited above.

From a practical perspective for some target products, the reactions achieve better yields and rates for the reactions if alkali metal alkoxides ($MOR^0$) are added to the first step of the reactions In addition, desirable reactants are more readily available for such processing. Nevertheless, for some organo ligands, better yields can be obtained with the introduction of the non-lithium alkali metal compounds. Thus, further exemplified embodiments involving potassium have the following overall reactions:

$$3HNR'_2 + 3LiR'' + KOR^0 + SnX_2 + RX' \rightarrow RSn(NR'_2)_3 + \text{byproducts, or}$$

$$3\ R'CCH + 3\ LIR'' + KOR^0 + SnX_2 + RX' \rightarrow RSn(CCR')_3 + \text{byproducts,} \qquad (5)$$

In the reactions represented by these equations, potassium (K) can be replaced with other non-Li alkali metal ions. The preparation of KSn (TMSA) 3 is adopted from the '316 application.

Presently, the isolation of the alkali metal tin triamides or alkali metal tin triacetylides have not been accomplished. The improved synthesis techniques are not contingent on the precise identity of the intermediates, and the general discussion herein focuses on the overall starting materials and the ultimate products that can be isolated and characterized. Nevertheless, the postulated identity of the intermediates, such as the KSn $(TMSA)_3$, is based on strong suppositions that follow from the species present. In the particular solvents used, metal ions are not expected to be well solvated. Yet, the compositions remain in solution, so large cluster formation and gelation is not observed. While not wanting to be limited by theory, organometallic reagents, for example alkyllithium, alkylmagnesium (Grignard reagent), and potassium tert-butoxide are known to form clusters, such as tetramers, hexamers, and cubanes, having metal-metal bonds, and it is therefore reasonable that similar species are formed in solution in possibly complex equilibrium mixtures that so far defy characterization. The relative stabilities of the known species then suggests what intermediate species can be expected to be present, but the precise structural characterization is not needed to understand their basic chemical involvement in the reactions. The reactivity of species would be consistent with the inability to remove the solvent to isolate the species.

While the overall reactions are presented above, these reactions can be performed in multiple steps. Since one of the reactants is tin dihalide, such as tin dichloride, a consideration for solvent selection can involve appropriate solubility of tin dihalide. The other initial reactants such as the dihydrocarbyl amine and the monoalkyl lithium (or generally the monoalkyl alkali metal), can be soluble in different solvents. In some embodiments, the reactants can be initially in slurry form due to partial solubility of the reactants. The reactions are generally performed in dry (i.e., substantially water free) organic solvents under an oxygen free or depleted atmosphere, such as a nitrogen purged atmosphere, argon or other inert atmosphere. Solvents can be selected to result in the solubility of the various components. Due to interactions of the solvent with the metal ions, selection of solvents can be based at least in part on reaction rates in the selected solvents, which can be evaluated empirically. If different solvents are selected, they are generally miscible. Aprotic polar solvents are generally useful, such as ethers (for example, dimethyl ether, diethyl ether), tetrahydrofuran (THF), acetone and mixtures thereof. The solvents should generally be selected to be inert with respect to the reactants, intermediates and products. If multiple solvents are used, for example to introduce distinct reactants, the solvents should generally be miscible with respect to each other. The first reaction can be considered the synthesis of a $MSnL_3$ intermediate, where L is dialkyl amide (dihydrocarbylamide) or alkyl acetylide (hydrocarbyl acetylide), although the particular structure has not been verified. From the reactants and reaction conditions, evidence does suggest formation of tin-ligand bonds, so the presence of the moiety $SnL_3$ seems likely, and the metal cations seem likely to be associated with the tin moieties for stabilization, but the particular structures may be present in complex equilibrium mixtures. This first reaction can be considered two separate reactions, if desired, with a first subreaction directed to the formation of a metal ligand composition (ML) and the subsequent subreaction with $SnCl_2$ or other tin dihalide. As described in detail, M can be an alkali metal, and alkaline earth metal and/or a pseudo-alkaline earth metal. In general, for the first reaction, the solutions are cooled, generally to less than 10° C. and in some embodiments 0° C., which can be a convenient temperature for use of an ice bath, although for non-aqueous solutions there is nothing special about this temperature. Cooling allows for desired control of the reaction while maintaining reasonable reaction rates, although the cool temperatures may not be maintained for the entire period of the reaction. The first subreaction can be performed for as long as is practical and is not particularly limited. The first subreaction can be allowed to continue for at least about 30 seconds, in other embodiments at least about 2 minutes, in some embodiments 1 minute to 5 hours and in some embodiments from about two minutes to about 3 hours. In some embodiments, the two subreactions can be combined and proceed essentially as a single reaction, which is effectively zero time for the first subreaction or short times for the first subreaction. If a non-lithium alkali metal alkoxide and/or an alkaline earth (or pseudo-alkaline earth) dihalide is introduced as a reactant, this compound can be added conceptually as part of the first subreaction or the second subreaction or potentially in the context of a third subreaction between the first subreaction and the second subreaction. A person of ordinary skill in the art will recognize that additional ranges of time and temperature within the explicit ranges above are contemplated and are within the present disclosure.

Generally, the alkyl lithium reactant and the amine/acetylene reactant are in rough stoichiometric amounts, although generally a small to moderate excess of the amine/acetylene reactant is used, such as from about 1 mole percent (mol %) to about 50 mol % amine/acetylene reactant can be used. Similar stoichiometric amounts or ligand precursors (dialkylamine or alkylacetylene/silylacetylene) can be used if a non-lithium alkyl alkali metal compound is used. Generally, it is desirable to have ML compositions in a 3:1 ratio relative to the molar amount of Sn to add three ligands for each tin. If a non-lithium metal alkoxy alkali metal compound is used along with alkyl lithium, the alkyl lithium can have an amount based on molar equivalents for the amine/acetylene reactant, while the non-alkali metal compound can have a molar amount equivalent to the tin compound to be added, although greater amounts of the metal (alkali metal or alkaline earth metal or pseudo-alkaline earth metal) can be used if desired, as long as additional amounts of ML are not formed. The tin reactant can be added, for corresponding embodiments, in an approximate molar equivalent (1:3) for the ML ligand contributing reactant to form three ligand tin bonds for each tin atom. The low amounts of contaminants from tin byproducts with 1, 2 or 4 ligands confirms the effectiveness of controlling the molar ratios of tin to ML reactants. The metal concentrations in the reactant solutions are generally from about 0.025M to about 2M, and in further embodiments from about 0.5 to about 1.5M. A person of ordinary skill in the art will recognize that concentration range and allowed stoichiometric ratios within the explicit ranges above are contemplated and are within the present disclosure.

The second reaction involves the introduction of a carbon-tin bond along with the formation of the organo ligand bound to the tin. The carbon-tin bond conceptually replaces a metal-tin bond, the metal being an alkali metal, alkaline earth metal, and/or pseudo-alkaline earth metal. The organo ligand to be bonded to the tin results from a reaction with an organohalide, RX. Generally, at least about a stoichiometric amount of organohalide is introduced for forming the carbon-tin bond, but an excess of the organohalide can be introduced. In some embodiments, up to a three-fold molar excess of the organohalide can be used in the reaction and in further embodiments from about 1 to about 2 molar equivalents of RX relative to moles of Sn can be used. The solvents can be the same or selected from the same available solvents and mixtures thereof as used for the first reaction. The products of the first reaction are generally not purified prior to performing the second reaction, although byproducts could be removed if convenient. The metal concentrations generally are similar to the concentrations of the first reaction step, although usually slightly smaller due to dilution. To account for the exothermic nature of the reaction, the second reaction can be generally, but not necessarily, started at a low temperature, such as about 0° C. or more generally about −78.5° C. to about 10° C., although in some embodiments, the reactants can be combined at room temperature. After mixing the reactants for the second reaction, the reaction can be allowed to continue at the same temperature or allowed to gradually warm to a temperature from about 20° C. to about 50° C. or room temperature (20-24° C.). The reaction can run for at least about 15 minutes, in some embodiments from about 15 minutes to about 24 hours, and in some embodiments from about 30 minutes to about 15 hours, although longer reaction times can be used, if desired. A person of ordinary skill in the art will recognize that additional ranges of concentration, molar ratios, temperatures and times give above for the second reaction are contemplated and are within the present disclosure.

Due to the exothermic nature of the reactions described herein, it can be beneficial to modify various parameters of the synthesis such as amounts of reactants, reaction temperatures, reagent addition times, reaction times, and the like. Such considerations are known by those of ordinary skill in the art. A useful analytical technique for analyzing the reactions and informing practitioners of suitable process conditions is reaction calorimetry. Calorimetric data can provide useful thermodynamic variables for a given reaction. In particular, scale-dependent variables (e.g., heats of enthalpy) can be measured for a desired reaction and used to properly conduct the reaction at larger scale. In this way, process variables can be suitably controlled for reactions at different scales. Reaction calorimetric data is included in some examples in the '316 application. Within the guidelines presented above along with the guidance of the examples blow, a person of ordinary skill in the art will recognize that specific parameters for a particular reaction can be adjusted to provide desired results. Optimization using routine experimentation can be performed by a person of ordinary skill based on these teachings for a wide range of product compositions. The reactions exemplified result in good yields and a high specificity for the product compositions.

Once the product is the organo tin formed, tri (dihydrocarbylamides/hydrocarbyl acetylides) can be purified. The purification depends on the nature of the product, but generally involves the separation of the desired product from by products and potentially any unreacted reagents. Purification can also comprise removal of any volatile compounds including solvents from the product mixture by drying or exposure to vacuum. For products with significant vapor pressures, it can be desirable to purify the product through vacuum distillation or, if desired, fractional distillation designed to achieve high purity. See published U.S. patent application 2020/0241413 to Clark et al., entitled "Monoalkyl Tin Trialkoxides and/or Monoalkyl Tin Triamides With Low Metal Contamination and/or Particulate Contamination and Corresponding Methods," incorporated herein by reference. Products can be also reacted to form derivatives, such as organo tin trialkoxides, which can be further purified by the techniques above and other means known in the art. Purification may or may not be performed prior to forming a trialkoxide.

In some embodiments, the hydrolysable ligand is an alkoxide. Alkoxides are particularly suitable as hydrolysable ligands for solution processing of oxide hydroxide coatings due to their shelf stability, hydrolytic susceptibility, and the relatively benign hydrolyzed products, i.e., alcohols. Conversion of organotin amides and acetylides into organotin alkoxides can generally be achieved via alcholysis as described by the following reactions:

$$RSn(CCR')_3 + 3R''OH + 3NR_3''' \rightarrow RSn(OR'')_3$$

wherein R is a hydrocarbyl group with 1-10 carbon atoms and one or more silicon or germanium atoms, and R', R", and R'" are the same or different and are generally alkyl groups with ≤12 carbon atoms. Particularly suitable groups are methyl, ethyl, propyl, butyl, pentyl (amyl), and, when applicable, their respective isomers, such as tert-butyl and tert-amyl.

In some embodiments, the photosensitive composition can be dissolved in a solvent to prepare an improved photoresist solution. Suitable solvents must of course include those that the improved photosensitive composition is suitably soluble in, but can be chosen based on their physical properties, such as flammability, viscosity, toxicity, or volatility. Other considerations for suitable solvents could be cost and potential interactions with other processing materials. Some examples of suitable solvents include alcohols (e.g., 4-methyl-2-pentanol, 1-butanol, cyclohexanol), esters (e.g., ethyl acetate, propylene glycol monomethyl ether acetate, ethyl lactate), ethers (e.g., propylene glycol monomethyl ether), ketones (e.g., 2-heptanone, cyclopentanone, cyclohexanone, 1-butanone, 4-methyl-2-pentanone), mixtures thereof, and the like. One of ordinary skill in the art will understand that other suitable solvents not explicitly listed are envisioned. The improved photoresist solutions can be used to form radiation patternable coatings as described below.

In some embodiments, the improved photosensitive compositions can be partially or fully hydrolysed prior to dissolution in a suitable solvent as described above. In such hydrolysed compositions, the hydrolysable ligands of the improved photosensitive composition are partially or fully replaced by O or OH ligands in condensed clusters comprising Sn—C, and Sn—O and/or Sn—OH bonds.

Radiation Patternable Coatings

A radiation patternable coating can be formed through deposition and subsequent processing of the photosensitive compositions onto a selected substrate. Deposition of radiation patternable coatings can be achieved through various means known by those of ordinary skill in the art. Particularly useful deposition techniques employing organotin materials have been described by Meyers et. al in U.S. Pat. No. 10,228,618 entitled "Organotin oxide hydroxide patterning compositions, precursors, and patterning", and by Wu et. al in PCT Patent App No. PCT/US2019/031618 entitled "Methods for Making EUV Patternable Hard Masks", incorporated herein by reference If solution deposition is desired, a particularly useful solution deposition method is spin coating. Spin coating is well known in the art and can be particularly useful for photoresist processing in semiconductor manufacturing. In a typical spin coating process, the photoresist solution is delivered to the surface of a substrate, such as a Si wafer, and the substrate is rapidly rotated to form a coating. During the spin coating process, the hydrolysable tin-ligand bonds of the organotin composition can react with atmospheric water to undergo significant hydrolysis and condensation, resulting in the formation of a coating on the substrate that comprises a Sn—O—Sn and Sn—OH network along with the radiation sensitive Sn—C bonds and potential interstitial, constitutional water. In some embodiments, the improved photoresist solutions are spin coated with a spin speed of between 500 and 3000 rpm. The spin speed is not particularly limited, but is generally tailored to yield a desired coating thickness. In general, slower spin speeds yield thicker coatings than faster spin speeds for a given photoresist solution. Those of ordinary skill in the art will understand the relationship between spin speed and coating thickness.

Coating thickness can also depend on the concentration of Sn in the photoresist solution. In some embodiments the [Sn] concentration in a suitable solvent is from 0.005 to about 1.0 M, in further embodiments from about 0.01 M to about 0.5 M, and in further embodiments from about 0.05 M to about 0.1 M. Those of ordinary skill in the art will understand that additional ranges of [Sn] concentration are contemplated and within the present disclosure.

The thickness of the radiation patternable coating can depend on the desired process. For use in single-patterning EUV lithography, coating thicknesses are generally chosen to yield patterns with low defectivity and reproducibility of the patterning. In some embodiments, suitable coating thickness can from between 0.5 nm and 100 nm, in further embodiments from about 1 nm to 50 nm, and in further embodiments from about 2 nm to 25 nm. Those of ordinary skill in the art will understand that additional ranges of coating thickness are contemplated and are within the present disclosure.

In other embodiments, the radiation patternable coating can be formed through various vapor deposition methods, such as atomic layer deposition (ALD), chemical vapor deposition (CVD), physical vapor deposition (PVD), and the like. In a typical vapor deposition technique, generally one or more metal-containing precursors are reacted with one or more small molecule gas-phase reagents such as $H_2O$, $H_2O_2$, $O_3$, $O_2$, or $CH_3OH$, which serve as O and H sources for production of oxides and oxide hydroxides. Thus, the hydrolysable compounds can be directly deposited via vapor phase hydrolysis as the corresponding alkyl tin oxide hydroxide coating, which can then be appropriately patterned.

In CVD methods, two or more reactant gases are generally mixed in the chamber in the vicinity of the substrate surface. Therefore, sufficient stability can be designed into the reaction conditions to control undesirable vapor-phase reactions and nucleation. ALD precursors, introduced separately and sequentially to the reaction chamber, typically react with chemisorbed co-precursor or decomposition products saturating the substrate surface. Desirable features of $RSnX_3$ precursors include, for example, sufficient volatility for vapor-phase transport in the system, thermal stability to prevent premature decomposition, and appropriate reactivity with co-precursors to produce the target product under prescribed process conditions. The pressure and temperature in the reaction chamber can be selected to control the reaction process.

Coating thickness for radiation patternable coatings prepared by vapor deposition techniques can generally be controlled through appropriate selection of reaction time or process cycles. The thickness of the radiation patternable coating can depend on the desired process. For use in single-patterning EUV lithography, coating thicknesses are generally chosen to yield patterns with low defectivity and reproducibility of pattern fidelity. In some embodiments, suitable coating thickness can from between 0.5 nm and 100 nm, in further embodiments from about 1 nm to 50 nm, and in further embodiments from about 2 nm to 25 nm. Those of ordinary skill in the art will understand that additional ranges of coating thickness are contemplated and are within the present disclosure.

The substrate generally presents a surface onto which the coating material can be deposited, and it may comprise a plurality of layers in which the surface relates to an upper most layer. The substrate is not particularly limited and can comprise any reasonable material such as silicon, silica, other inorganic materials, such as ceramics, and polymer materials.

After deposition and formation of the radiation sensitive coating, further processing can be employed prior to exposure with radiation. In some embodiments, the coating can be heated from between 30° C. and 300° C., in further embodiments from between 50° C. and 200° C., and in further embodiments from between 80° C. and 150° C. The heating can be performed, in some embodiments for about 10 seconds to about 10 minutes, in further embodiments from about 30 seconds to about 5 minutes, and in further embodiments from about 45 seconds to about 2 minutes. Additional ranges for temperatures and heating durations within the above explicit ranges are anticipated and envisioned. These heating processes may be conducted under atmospheric conditions or under controlled partial pressures of gases such as $H_2O$, $CO_2$, CO, $H_2$, $N_2$, $H_2S$, HCl, Ar, and others to affect patterned structure defectivity and reproducibility.

The stability of the radiation sensitive coating material can be evaluated in the coating. In particular, the thermal stability of a particular R group can be evaluated spectroscopically during a pre-irradiation heating step. The stability can be conveniently followed using FTIR spectroscopy by summing the magnitude of absorptions associated with the CH vibrations (for example, C—H stretching and bending modes (2957, 2924, 2858, 1391, and 1331 $cm^{-1}$)) as a function of heating temperature from 50° C. to 250° C. where heating is performed for 120 seconds. This is estimated by calculating the area under the range from 3005 $cm^{-1}$ to 2765 $cm^{-1}$. A drop in infrared intensity corresponds with a loss of the R group from the coating. In general, it is desirable for the R group to remain relatively constant within the coating up to some temperature, but then quickly leave the film (i.e., decompose) above that temperature such as to give a steep negative slope on a plot of CH absorption vs. bake temperature. To evaluate the films in this stability testing, the temperature at which the infrared absorption drops below 95% if the initial value can be used to compare films.

Patterning of the Compositions

Radiation generally can be directed to the coated substrate through a mask or a radiation beam can be controllably scanned across the substrate. In general, the radiation can comprise electromagnetic radiation, an electron-beam (beta radiation), or other suitable radiation. In general, electromagnetic radiation can have a desired wavelength or range of wavelengths, such as visible radiation, ultraviolet radiation, or X-ray radiation. The resolution achievable for the radiation pattern is generally dependent on the radiation wavelength, and a higher resolution pattern generally can be achieved with shorter wavelength radiation. Thus, it can be desirable to use ultraviolet light, X-ray radiation, or an electron-beam to achieve particularly high-resolution patterns.

Following International Standard ISO 21348 (2007) incorporated herein by reference, ultraviolet light extends between wavelengths of greater than or equal to 100 nm and less than 400 30 nm. A krypton fluoride laser can be used as a source for 248 nm ultraviolet light. The ultraviolet range can be subdivided in several ways under accepted Standards, such as extreme ultraviolet (EUV) from greater than or equal 10 nm to less than 121 nm and far ultraviolet (FUV) from greater than or equal to 122 nm to less than 200 nm. A 193 nm line from an argon fluoride laser can be used as a radiation source in the FUV. EUV light at 13.5 nm has been used for lithography, and this light is generated from a Xe or Sn plasma source excited using high energy lasers or discharge pulses. Soft x-rays can be defined from greater than or equal to 0.1 nm to 5 less than 10 nm.

The amount of electromagnetic radiation can be characterized by a fluence or dose which is obtained by the integrated radiative flux over the exposure time. In some embodiments, suitable radiation fluences can be from about 1 $mJ/cm^2$ to about 200 $mJ/cm^2$, in further embodiments from about 2 $mJ/cm^2$ to about 150 $mJ/cm^2$ and in further embodiments from about 3 $mJ/cm^2$ to about 100 $mJ/cm^2$. In an embodiment, the EUV radiation can be done at a dose of less than or equal to about 150 $mJ/cm^2$ or with an electron beam at a dose equivalent to or not exceeding about 2 $mC/cm^2$ at 30 kV. A person of ordinary skill in the art will recognize that additional ranges of radiation fluences within the explicit ranges above are contemplated and are within the present disclosure.

Based on the design of the coating material, there can be a large contrast of material properties between the irradiated regions that have condensed coating material and the unirradiated coating material with substantially intact Sn—C bonds. For embodiments in which a post irradiation heat treatment is used, the post-irradiation heat treatment can be performed at temperatures from about 45° C. to about 300° C., in additional embodiments from about 50° C. to about 225° C. and in further embodiments from about 60° C. to about 175° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of post-irradiation heating temperature and times within the explicit ranges above are contemplated and are within the present disclosure. This high contrast in material properties further facilitates the formation of high-resolution lines with smooth edges in the pattern following development as described in the following section.

For the negative tone imaging, the developer can be an organic solvent, such as the solvents used to form the precursor solutions. In general, developer selection can be influenced by solubility parameters with respect to the coating material, both irradiated and unirradiated, as well as developer volatility, flammability, toxicity, viscosity and potential chemical interactions with other process materials. In particular, suitable developers include, for example, alcohols (e.g., 4-methyl-2-pentanol, 1-butanol, isopropanol, 1-propanol, methanol), ethyl lactate, ethers (e.g., tetrahydrofuran, dioxane, anisole), ketones (pentanone, hexanone, 2-heptanone, octanone) and the like. The development can be performed for about 5 seconds to about 30 minutes, in further embodiments from about 8 seconds to about 15 minutes and in additional embodiments from about 10 seconds to about 10 minutes. A person of ordinary skill in the art will recognize that additional ranges within the explicit ranges above are contemplated and are within the present disclosure. In addition to the primary developer composition, the developer can comprise additives that facilitate the development process. Suitable additives may include, for example, viscosity modifiers, dissolution accelerants, or other processing aides. If the optional additives are present, the developer can comprise no more than about 10 weight percent additive and in further embodiments no more than about 5 weight percent additive. A person of ordinary skill in the art will recognize that additional ranges of additive concentrations within the explicit ranges above are contemplated and are within the present disclosure.

With a weaker developer, e.g., dilute organic developer or compositions in which the coating has a lower development rate, a higher temperature development process can be used to increase dissolution rates. With a stronger developer, the temperature of the development process can be lower to reduce the rate and control the kinetics of the development. In general, the temperature of the development can be adjusted between the appropriate values consistent with the volatility of the solvents. Additionally, developer with dissolved coating material near the developer-coating interface can be dispersed with ultrasonication during development. The developer can be applied to the patterned coating material using any reasonable approach. For example, the developer can be sprayed onto the patterned coating material. Also, spin coating can be used. For automated processing, a puddle method can be used involving the pouring of the developer onto the coating material in a stationary format. If desired, spin rinsing and/or drying can be used to complete the development process. Suitable rinsing solutions include, for example, ultrapure water, aqueous tetraalkyl ammonium hydroxide, methyl alcohol, ethyl alcohol, propyl alcohol and combinations thereof. After the image is developed, the coating material is disposed on the substrate as a pattern.

In some embodiments, a solvent-free (dry) development process may be conducted through the use of an appropriate thermal development or plasma development process, such as those described by Tan et. al in PCT Pat App. No: PCT/US2020/039615 entitled "Photoresist Development With Halide Chemistries", incorporated herein by reference. For organotin photoresist coatings, dry development can be conducted with halogen-containing plasmas and gases, for example HBr and $BCl_3$. In some cases, dry development may offer advantages over wet development such as reduced pattern collapse, decreased scum, and fine control via development conditions and compositions, i.e. the plasma and/or etch gases.

After completion of the development step, the coating materials can be heated to further dehydrate and condense the material, remove residual developer, or both. The development process generally results in the formation of nanoscale features that have at least one dimension with a size less than a micron, and often a thickness and width on a nanoscale. This heat treatment can be particularly desirable for embodiments in which the oxide coating material is incorporated into the ultimate device, although it may be desirable to perform the heat treatment for some embodiments in which the coating material is used as a resist and ultimately removed. In particular, the step of baking the patterned coating material can be performed under conditions that produce desired levels of etch selectivity. In some embodiments, the patterned coating material can be heated to a temperature from about 100° C. to about 600° C., in further embodiments from about 175° C. to about 500° C. and in additional embodiments from about 200° C. to about 400° C. The heating can be performed for at least about 1 minute, in other embodiment for about 2 minutes to about 1 hour, in further embodiments from about 2.5 minutes to about 25 minutes. The heating may be performed in air, vacuum, or an inert gas ambient, such as Ar or $N_2$. A person of ordinary skill in the art will recognize that additional ranges of temperatures and time for the heat treatment within the explicit ranges above are contemplated and are within the present disclosure. Likewise, non-thermal treatments, including blanket UV exposure, or exposure to an oxidizing plasma such as $O_2$ may also be employed for similar purposes.

EXAMPLES

Example 1. Method to Prepare (1) Ethyltrimethylsilyltin Tris (Trimethylsilylacetylide) and (2) Conversion to Alkoxide This example is directed to a synthesis based on the following two reactions to form the silicon containing alkyl ligand bonded to the tin through a C—Sn bond. Experiments described in all of the examples are performed under oxygen depleted inert atmospheres, such as nitrogen, argon or other inert atmospheres.

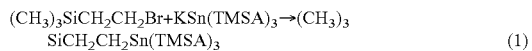

(1)

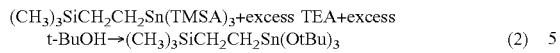

(2)

(1) n-Butyllithium (2.6 M in hexanes) was added to a cold (−50° C.) solution of trimethylsilylacetylene in diethyl ether. After a few minutes, a slurry of $SnCl_2$ and KOtBu in THF was added. The contents were stirred for at least 2 hours while warming to room temperature. The newly formed KSn(TMSA) 3 was cooled to −50° C. and a solution of bromoethyltrimethylsilane in diethyl ether was added slowly. After stirring for 16 hours, the solvent was removed in vacuo. The product was extracted with pentane and filtered to remove precipitated salts. Pentane was removed to give ethyltrimethylsilyltin tris(trimethylsilylacetylide) as a wax-like low melting point solid.

(2) The product from (1) was dissolved in a solution of triethylamine (TEA) and t-butanol and heated at 80° C. for 40 hours. Unreacted TEA and tBuOH were removed in vacuo and ethyltrimethylsilyltin tris(tert-butoxide) [$(CH_3)_3SiC_2H_4Sn$ $(OC_4H_9)_3$] was isolated by distillation as a liquid.

FIG. 1 is the $^{119}Sn$ NMR spectrum of $(CH_3)_3SiCH_2CH_2Sn$ $(TMSA)_3$, which displays the following chemical shifts: $^{119}Sn$ NMR (149 MHZ, $C_6D_6$) δ −269.25 ppm.

Figure 2:
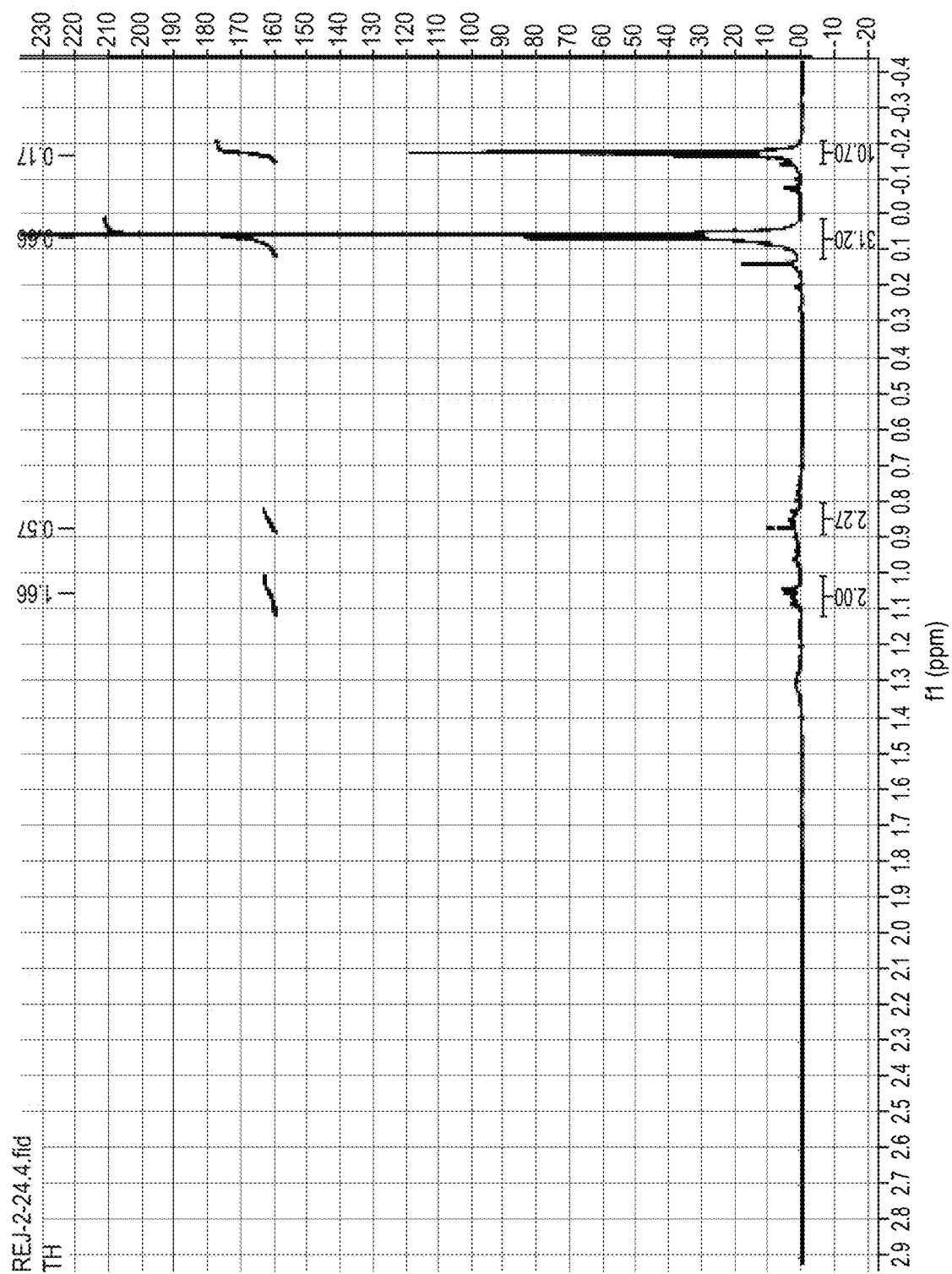
FIG. 2 is a plot of a 1H NMR spectrum of ethyltrimethylsilyltin tris(trimethylsilylacetylide) $[(CH_3)_3SiCH_2CH_2Sn(TMSA)_3]$.

FIG. 2 is the $^1H$ NMR spectrum of $(CH_3)_3SiCH_2CH_2Sn$ $(TMSA)_3$, which displays the following chemical shifts: $^1H$ NMR (400 MHZ, $C_6D_6$) δ −0.17 (s, 9H), 0.06 (s, 27H), 0.87 (m, 2H), 1.05 (m, 2H) ppm.

Figure 3:
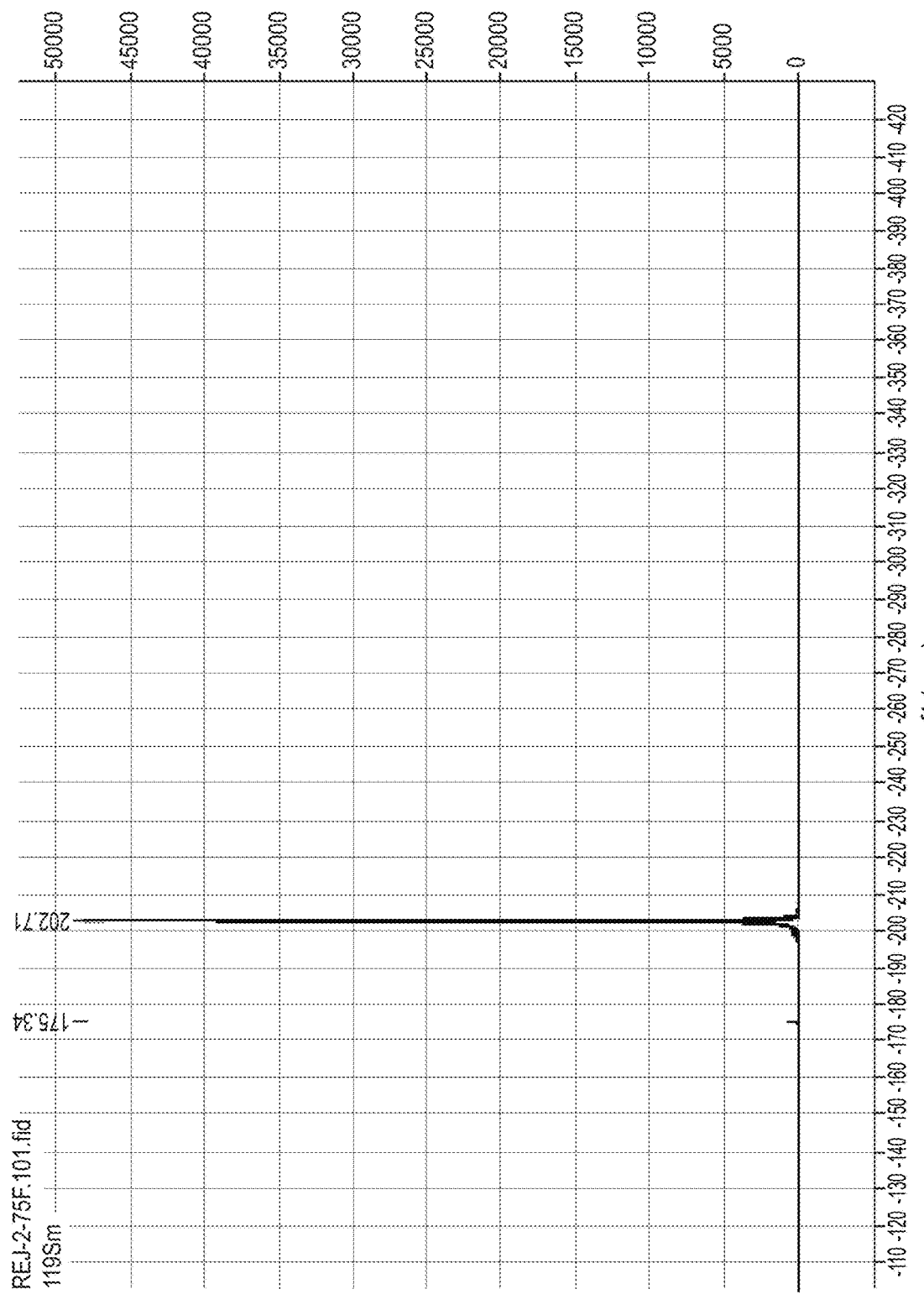
FIG. 3 is a plot of a $^{119}$Sn NMR spectrum of ethyltrimethylsilyltin tris(tert-butoxide) $(CH_3)_3SiCH_2CH_2Sn(OC(CH_3)_3)_3$.

FIG. 3 is the $^{119}Sn$ NMR spectrum of $(CH_3)_3SiCH_2CH_2Sn$ $(Ot-Bu)_3$, which displays the following chemical shifts: $^{119}Sn$ NMR (149 MHZ, neat) δ −202.71 ppm.

Figure 4:
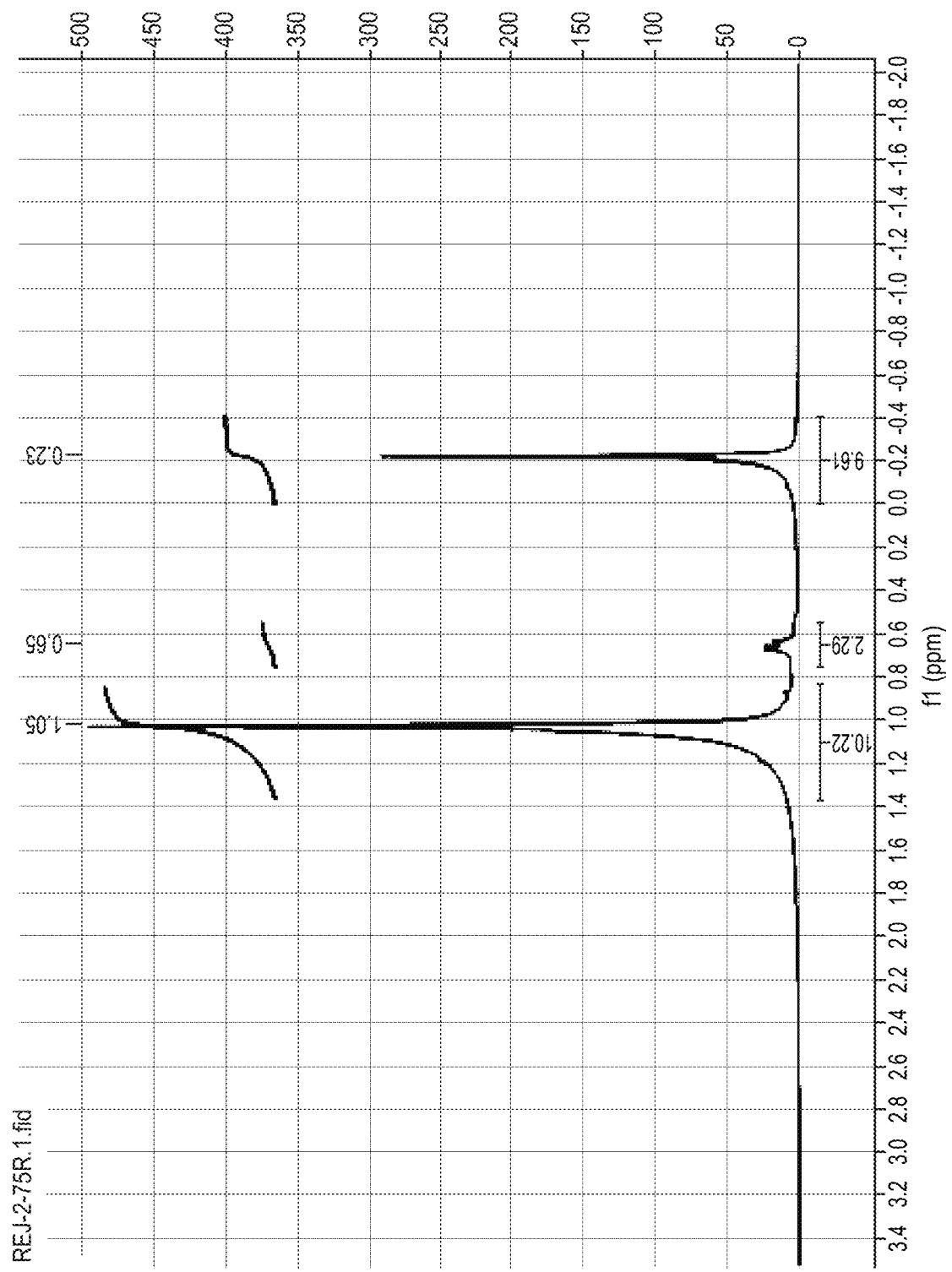
FIG. 4 is a plot of a 1H NMR spectrum of ethyltrimethylsilyltin tris(tert-butoxide) $(CH_3)_3SiCH_2CH_2Sn(OC(CH_3)_3)_3$.

FIG. 4 is the $^1H$ NMR spectrum of $(CH_3)_3SiCH_2CH_2Sn$ $(Ot-Bu)_3$, which displays the following chemical shifts: $^1H$ NMR (400 MHZ, neat) δ −0.23 (s, 9H), 0.65 (m, 2H), 1.03 (s, 27H; m, 2H) ppm.

Example 2. Precursor Formulation

To prepare 100 ml of resist solution, 1.45 mL of $(CH_3)_3$ $SiC_2H_4Sn$ $(OC_4H_9)_3$(FW=439.29, ρ=1.06 g/cm$^3$), synthesize according to Example 1, was added to a glass container in a glove box. 4-methyl-2-pentanol was then added to the container to produce a final Sn concentration of 0.035 M. This formulation and coating derived from it, as described in Example 3, are designated as E-TMS.

Example 3. Deposition of Resist Coating

This Example describes the formation of a coating for patterning based on the precursor solution of Example 2.

10.2-cm diameter circular silicon wafers with a native-oxide surface were used as substrates for film deposition. The precursor was spin coated onto the Si wafers at 1500 RPM for 45 seconds. The wafers were then baked at selected temperatures between 10° and 180° C. for times up to 120 seconds. Film thickness following coating and baking was measured via spectroscopic ellipsometry to be approximately 20 nm. All films exhibit root-mean-square surface roughness <0.5 nm, as measured by atomic force microscopy.

Figure 5:
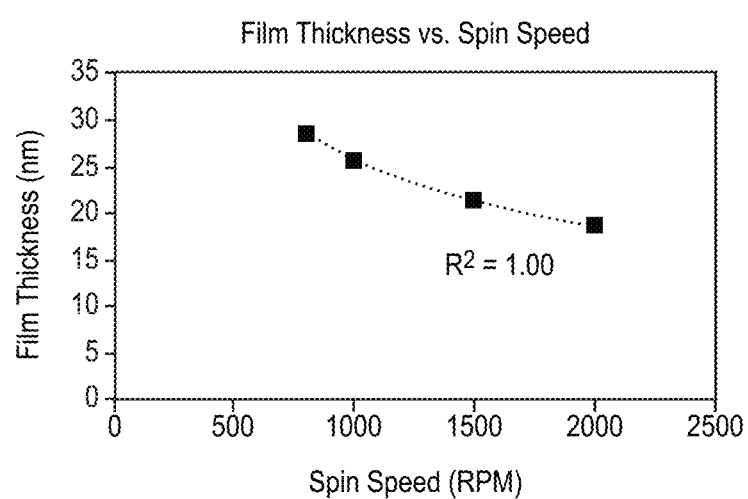
FIG. 5 is a plot of film thickness vs. spin speed for E-TMS resist formulation.

The precursor was also coated on 300-mm Si wafers at selected spin speeds on a Lithius PROZ track at the Interuniversity Microelectronics Centre (IMEC). Film thickness was measured by spectroscopic ellipsometry. FIG. 5 illustrates the relationship between film thickness and spin speed.

Example 4. Contrast and Patterning

Contrast

A 25.9±0.3 nm film of E-TMS was coated on an SOG ("spin on Glass", approximately 8.5 nm thick) underlayer on a silicon wafer. The film and a Commercial Grade Inpria reference material (YATU1011™) were exposed using an EUV NXE3400C scanner operating at a wavelength of 13.5 nm with an open frame, i.e., no mask. The scanner exposed pad arrays on each wafer. The wafers were baked at selected temperatures, developed with an organic solvent, and then baked at 250° C. to eliminate any developer residue. The thickness of each pad was then measured via ellipsometry.

Figure 6:
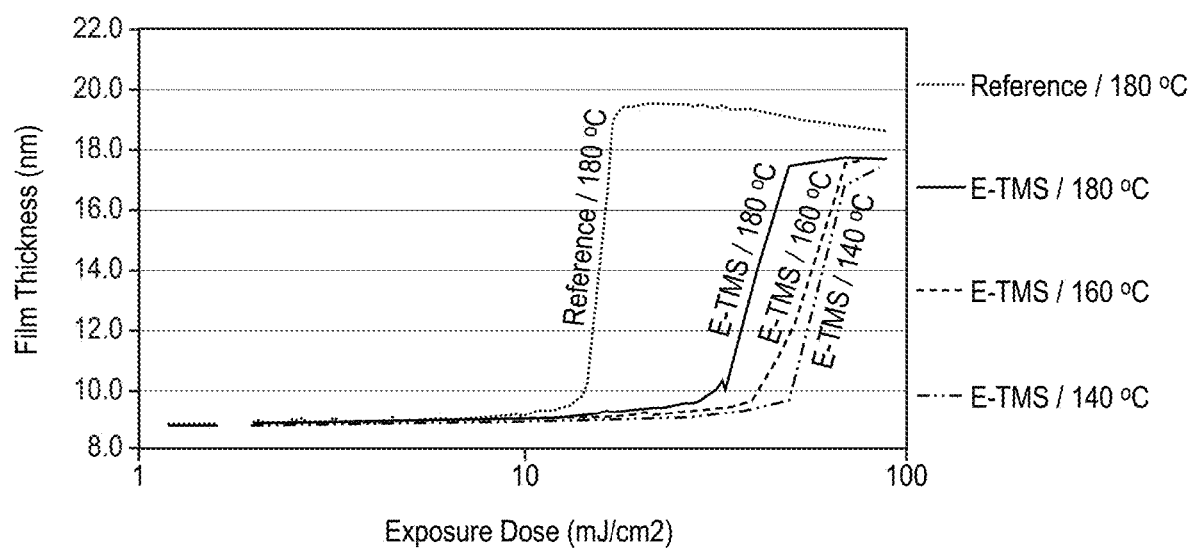
FIG. 6 is a plot of contrast curves for E-TMS resist processed at selected post-exposure bake temperatures.

FIG. 6 shows the derived contrast curves for the reference material and the E-TMS material at 140, 160, and 180° C. The table below summarizes relevant parameters extracted from these curves. Dg, or dose-to-gel, is the dose at which the full film thickness is achieved; DO is the highest dose of 0 thickness; and Contrast is the log-slope of the curve between DO and Dg. The E-TMS material achieves full thickness at a significantly higher dose than the reference material.

| Photoresist | Post Exposure Bake and Time | $D_g$ (mJ/cm$^2$) | $D_0$ (mJ/cm$^2$) | Contrast |
|---|---|---|---|---|
| Reference | 180° C./60 s | 17.5 | 11.7 | 5.7 |
| E-TMS | 180° C./60 s | 47.8 | 15.1 | 2.0 |
| E-TMS | 160° C./60 s | 70.0 | 33.0 | 0.1 |
| E-TMS | 140° C./60 s | 90.0 | 50.0 | 0.1 |

Patterning

A series of the E-TMS films were deposited at a film thickness of 25.6±0.3 nm on SOG-coated silicon wafers. The sample films and the Inpria reference film as described above were exposed with an NXE3400C EUV scanner employing a mask designed to print a 16P32 (16 nm linewidth on 32 nm pitch) pattern. The exposed films were baked at various temperatures and then developed with an organic solvent. Following development, the films were baked at 250° C. to eliminate developer residue.

Figure 7:
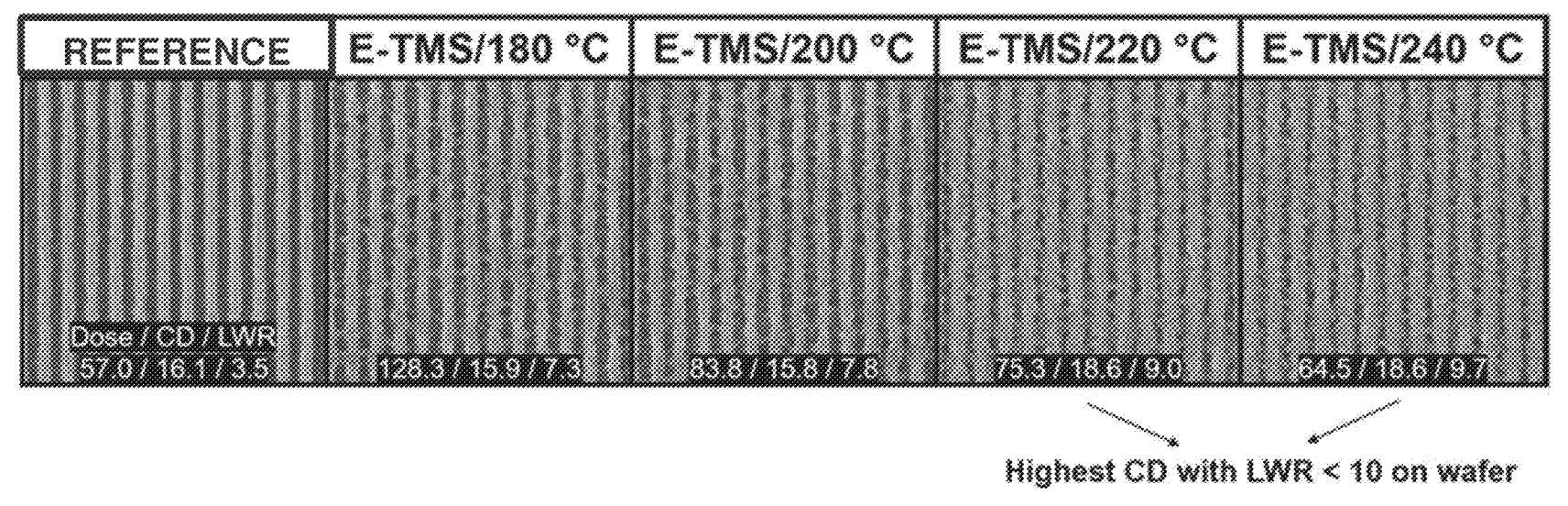

The resulting patterns were imaged on a Hitachi CG5000 CD-SEM (critical dimension scanning electron microscope) with a beam voltage of 800 V and beam current of 8.0 pA. FIG. 7 shows selected images and summarizes Dose (mJ/cm$^2$), Linewidth (CD, nm), and Linewidth Roughness (LWR, nm) for each pattern. The caption at the top of each image identifies the post-exposure bake temperature. Each pattern represents the CD closest to the target linewidth (16 nm). The target CD was not present in developed structures on the wafers baked at 220 and 240° C., so the highest CDs with an LWR <10 nm are shown.

Example 5. Evaluation of Thermal Stability

This example compares the thermal stability of an organotin composition having a Si-substituted ligand and an organotin composition having a non-substituted ligand composition.

Figure 8:
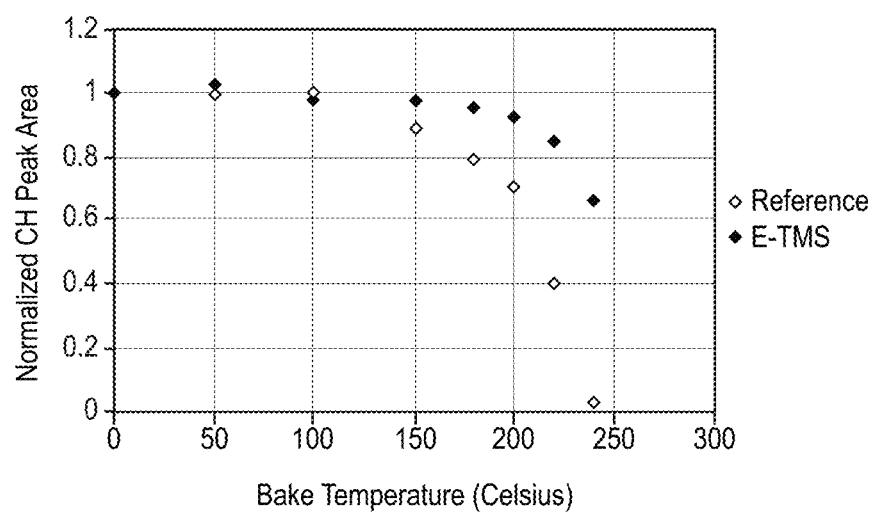
FIG. 8 is a plot comparing normalized FTIR CH absorbance versus bake temperature for a film formed with an E-TMS resist formulation and a film formed with a reference resist formulation.

E-TMS was coated on a set of silicon wafers according to the method of Example 3. An Inpria reference material having an unsubstituted hydrocarbon ligand bonded to Sn was coated on a second set of silicon wafers. The wafers were then baked at selected temperatures between 5° and 240° C. for 120 seconds. Fourier Transform Infrared (FTIR) transmission spectra of each film was collected on a Nicolet 6700 spectrometer using a bare substrate as a background. The thickness-normalized, summed CH absorbance peak area from 2765 cm-1 to 3005 cm-1 attributed to some hydrocarbon C—H stretching and bending modes (2957, 2924, 2858 cm-1) for each spectra was plotted as a function of bake temperature as shown in FIG. 8. The CH absorbance peak area for the reference film was lower than the peak area for the E-TMS film at bake temperatures of roughly 110 to 120° C. and above. As the bake temperature increased, the percent difference between the peak areas increased. At 200° C., the normalized peak area for the E-TMS film was about 93% and the normalized peak area for the reference film was about 70%. The reference film dropped below 95% normalized absorption around 125° C., and the E-TMS film dropped below 95% normalized absorption around 175° C. The results show that the E-TMS film is more thermally stable than the reference film. This example provides evidence of the higher thermal stability provided by organo ligands having high atomic number heteroatoms. The results suggest that heteroatoms in the ligand stabilize the C—Sn bond between the ligand and the Sn atom.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understood that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

What we claim is:

1. A method for patterning an organometallic compound comprising:
    forming a coating on a substrate, wherein forming the coating comprises depositing $RSnL_3$, wherein R is a hydrocarbyl group with 1-20 carbon atoms and one or more silicon or germanium heteroatoms, and L is a hydrolysable ligand;
    irradiating the coating with radiation to form a latent image; and
    developing the image to form a patterned coating with nanoscale features according to the latent image.

2. The method of claim 1 wherein the hydrolysable ligand comprises an alkoxide, a dialkylamide, or an alkyl/silyl acetylide.

3. The method of claim 1 wherein the substrate comprises silicon.

4. The method of claim 1 wherein the depositing comprises vapor deposition, spin coating, spray coating, or dip coating.

5. The method of claim 1 wherein the coating has an average thickness from 0.5 nm to 100 nm.

6. The method of claim 1 wherein the coating has a root-mean square surface roughness of less than 0.5 nm as measured by atomic force microscopy.

7. The method of claim 1 further comprising heating the coating to a temperature between about 30° C. and 300° C. for a period of time of about 10 seconds to about 10 minutes prior to irradiating the coating.

8. The method of claim 1 wherein the heating is performed under controlled partial pressures of gases, wherein the gases comprise $H_2O$, $CO_2$, CO, $H_2$, $N_2$, $H_2S$, HCl, an inert gas, or a combination thereof.

9. The method of claim 1 wherein the irradiating comprises UV radiation or EUV radiation at a dose of about 1 $mJ/cm^2$ about 200 $mJ/cm^2$ or an electron beam at a dose equivalent to or not exceeding about 2 $mC/cm^2$ at 30 kV.

10. The method of claim 1 further comprising heating the coating to a temperature of 45° C. to about 300° C. for a period of time of at least about 0.1 minute to about 30 minutes after irradiating the coating the coating.

11. The method of claim 1 wherein the developing comprises an organic solvent or wherein the developing comprises a solvent-free process.

* * * * *